United States Patent
Biswas et al.

(10) Patent No.: US 11,853,665 B2
(45) Date of Patent: Dec. 26, 2023

(54) PERFORMING HARDWARE DESCRIPTION LANGUAGE TRANSFORMATIONS

(71) Applicant: Synopsys, Inc., Mountain View, CA (US)

(72) Inventors: Parijat Biswas, Bangalore (IN); Minakshi Chakravorty, Bengaluru (IN); Sitikant Sahu, Bangalore (IN)

(73) Assignee: Synopsys, Inc., Sunnyvale, CA (US)

(*) Notice: Subject to any disclaimer, the term of this patent is extended or adjusted under 35 U.S.C. 154(b) by 0 days.

(21) Appl. No.: 17/490,700

(22) Filed: Sep. 30, 2021

(65) Prior Publication Data

US 2022/0108056 A1   Apr. 7, 2022

Related U.S. Application Data

(60) Provisional application No. 63/088,087, filed on Oct. 6, 2020.

(51) Int. Cl.
*G06F 30/323*      (2020.01)
(52) U.S. Cl.
CPC .................................. *G06F 30/323* (2020.01)
(58) Field of Classification Search
CPC .................................................... G06F 30/323
USPC ............................................................ 716/103
See application file for complete search history.

(56) References Cited

U.S. PATENT DOCUMENTS

| | | | | |
|---|---|---|---|---|
| 7,389,489 B1* | 6/2008 | Chesal | ................... | G06F 30/34 716/103 |
| 7,503,027 B1* | 3/2009 | Zhao | ............. | G01R 31/318357 716/104 |
| 7,685,555 B1* | 3/2010 | Bertrand | ............... | G06F 30/327 716/102 |
| 8,176,449 B1* | 5/2012 | Petithomme | ........... | G06F 30/34 716/136 |
| 8,443,314 B1* | 5/2013 | El-Zein | ................. | G06F 30/327 716/104 |
| 11,281,834 B1* | 3/2022 | Klair | ....................... | G06F 9/445 |
| 11,443,088 B1* | 9/2022 | Verma | ................... | G06F 30/331 |
| 2003/0144826 A1* | 7/2003 | Mandell | ............. | G06F 30/3323 703/14 |
| 2008/0224727 A1* | 9/2008 | Verbauwhede | .......... | G06F 7/00 326/8 |
| 2019/0286763 A1* | 9/2019 | Kastner | .............. | G06F 30/3312 |

* cited by examiner

*Primary Examiner* — Suchin Parihar
(74) *Attorney, Agent, or Firm* — Park, Vaughan, Fleming & Dowler LLP; Laxman Sahasrabuddhe

(57) ABSTRACT

Hardware description language (HDL) code for an integrated circuit (IC) design may be parsed to obtain an IC design parse tree. A transformation pattern may include a first pattern and a second pattern. The transformation pattern may be parsed to obtain a transformation pattern parse tree. The IC design parse tree and the transformation pattern parse tree may be used to identify a portion of the HDL code that matches the first pattern. The identified portion of the HDL code may be transformed based on the second pattern to obtain a transformed portion of the HDL code. The portion of the HDL code may be replaced by the transformed portion of the HDL code.

17 Claims, 8 Drawing Sheets

```
module top;

reg clk, b, c, d, e;

always @(posedge (clk && (clk !== 1'bx)))
    begin
       b = 1'b1;
       $display("always 1");
    end always @(posedge (clk && (clk !== 1'bx)))
    begin
       c = 1'b1;
       $display("always 2");
    end initial begin
       clk = 1'b0;
       #(5);
       clk = 1'b1;
       #(5);
    end endmodule
```

FIG. 4

```
(* vpt_module_from *)

module test1_pat;
    wire  a;
    always @(posedge (a && (a !== 1'bx)))
       $vptStmt("stmt1");

initial begin
   $vptNodeProperty(a, "type:ignore");
end endmodule
```
— 502

```
(* vpt_module_to *)

module test1_pat_X;
    wire  a;
    always @(posedge a) begin
      if (a !== 1'bx) begin
        $vptStmt("stmt1");
      end
    end endmodule
```
— 504

FIG. 5

```
module top;
    reg clk, b, c, d, e;
    initial begin
        clk = 1'b0;
        #(5);
        clk = 1'b1;
        #(5);
    end always @(posedge clk) begin
        if (clk !== 1'bx) begin
            begin
                b = 1'b1;
                $display("always 1");
            end
        end
    end always @(posedge clk) begin
        if (clk !== 1'bx) begin
            begin
                c = 1'b1;
                $display("always 2");
            end
        end
    end
endmodule
```

FIG. 6

PERFORMING HARDWARE DESCRIPTION LANGUAGE TRANSFORMATIONS

RELATED APPLICATION

This application claims the benefit of U.S. Provisional Application Ser. No. 63/088,087, filed on 6 Oct. 2020, the contents of which are herein incorporated by reference in their entirety for all purposes.

TECHNICAL FIELD

The present disclosure relates to an electronic design automation (EDA) system. More specifically, the present disclosure relates to a system and method for performing hardware description language (HDL) transformations.

BACKGROUND

Advances in process technology and an increasing demand for computing and storage have fueled an increase in the size and complexity of integrated circuit (IC) designs. Circuit designs may be described using an HDL. An HDL is a computer language that may be used to describe the functionality of an IC design. An HDL description may be synthesized into a netlist of components with their associated connectivity.

SUMMARY

Embodiments described herein feature techniques and systems for performing HDL transformations. HDL code for an IC design may be parsed to obtain an IC design parse tree. A transformation pattern may be parsed to obtain a transformation pattern parse tree, where the transformation pattern may include a first pattern and a second pattern. The IC design parse tree and the transformation pattern parse tree may be used to identify a portion of the HDL code that matches the first pattern. The portion of the HDL code may be transformed based on the second pattern to obtain a transformed portion of the HDL code. Next, the portion of the HDL code may be replaced by the transformed portion of the HDL code.

In some embodiments described herein, the first pattern and the second pattern may be specified using a language extension of the HDL.

In some embodiments described herein, identifying the portion of the HDL code that matches the first pattern may include matching the transformation pattern parse tree with a portion of the IC design parse tree that corresponds to the portion of the HDL code.

In some embodiments described herein, identifying the portion of the HDL code that matches the first pattern may include matching a property specified in the first pattern with a property of the portion of the HDL code.

In some embodiments described herein, the IC design parse tree and the transformation pattern parse tree may be maintained separately.

In some embodiments described herein, the first pattern may include one or more expression patterns, one or more statement patterns, one or more statement block patterns, or a combination thereof.

In some embodiments described herein, the IC design may be simulated using the transformed portion of the HDL code.

BRIEF DESCRIPTION OF THE FIGURES

The disclosure can be understood based on the detailed description given below and the accompanying figures. The figures are for illustrative purposes, and do not limit the scope of the disclosure. Furthermore, the figures are not necessarily drawn to scale.

FIGS. 4-6 illustrate examples of transforming IC design code based on a transformation pattern in accordance with some embodiments described herein.

DETAILED DESCRIPTION

Figure 1:
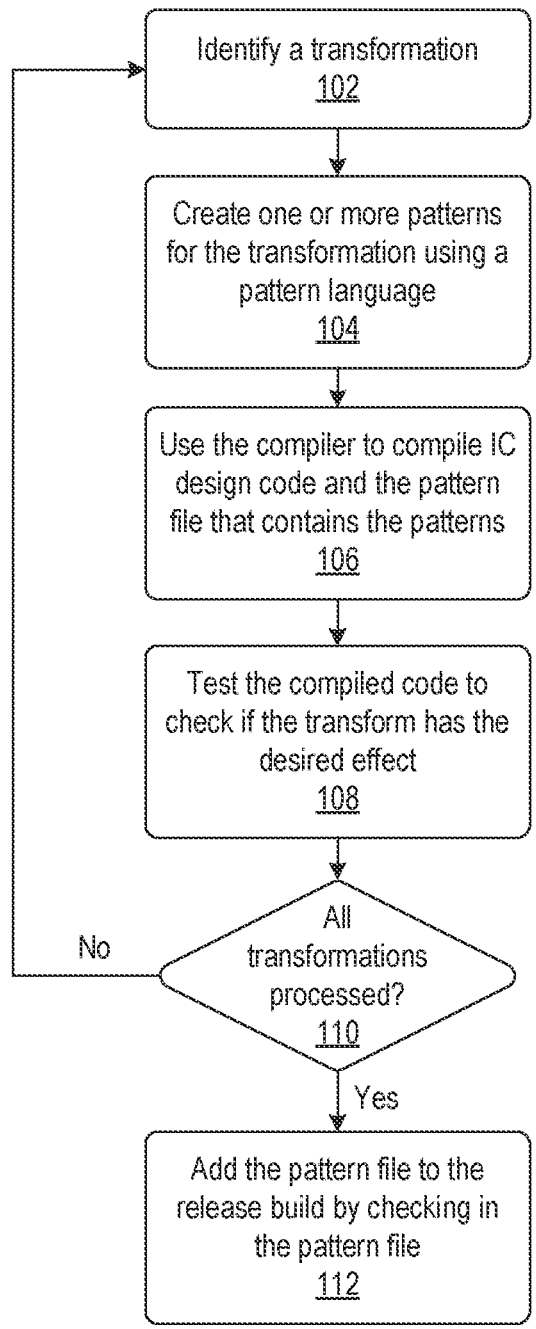
FIG. 1 illustrates a process for performing HDL transformations in accordance with some embodiments described herein.

Transforming IC designs may be important to help debug IC designs and/or meet performance goals. HDL code may be transformed manually by a user when the user changes the HDL code. If an HDL compiler supports a particular HDL transformation, then the HDL compiler may perform the transformation when compiling HDL code. HDL code transformation may be used to achieve one or more goals, which may include, but are not limited to fixing a bug, improving performance, and adding debug hooks to the original code. The modifications or transformations should not modify the source code intent.

Some transformations may be specific to a particular IC design style (an IC design style may refer to a set of high-level decisions that dictate the overall architecture of the IC design, e.g., whether to use a pipeline architecture in the IC design), and in some cases, the transformations may be specific to a dynamic data pattern that is observed in a specific IC design. A data pattern may refer to signal values (where each signal may be represented by a variable in the HDL code) in the IC design. A dynamic data pattern may refer to a sequence of signal values that are observed during operation of the IC design. A transformation may improve performance in one design, but the same transformation may potentially degrade the performance in another design.

For example, consider the HDL code shard "for (I=0; I<100; i++) B=B+I." The performance of this HDL code shard may be improved by transforming the HDL code shard as follows: "B=B+4950; I=99." The transformed code shard does not include a for loop in which the "B=B+I" statement is executed in each iteration, which improves performance.

HDL code may be transformed using a manual process, i.e., the HDL code may be manually modified. On the other hand, a transformation may be implemented in the compiler. However, this is also a manual process that may use a large amount of resources and take a long time (e.g., 8-10 months).

Approaches that perform transformations have many drawbacks, including, but not limited to: (1) manual HDL code transformation is not always feasible and may be error prone, (2) a user may not allow changing the HDL code, (3) HDL code changes may be visible to competitors and benefit them, (4) the HDL code may be stored in a read-only repository, (5) similar transformations may be needed in too many places in the HDL code, and (6) manually performing the transformations uses a large amount of resources and time. When transformations are performed manually, the build with the transformed HDL code may need to be downloaded by a user, which creates additional drawbacks. Specifically, (1) often, only the user can download the build, and the user that transformed the HDL code may need to wait for multiple days before the user downloads the build, (2) the build may not work the first time, and (3) multiple iterations may be needed before the transformed HDL code works as desired, and each iteration may use a significant amount of time.

Some embodiments described herein overcome the above-mentioned drawbacks by extending an HDL. Specifically, some embodiments described herein may extend the HDL by adding transformation semantics to the HDL. In some embodiments, the HDL extension may include a "from" pattern (e.g., a first pattern) and a "to" pattern (e.g., a second pattern). Some embodiments feature an HDL compiler (which may be implemented by a processor executing software instructions) that understands the HDL extensions that specify transformational semantics. The HDL compiler may match the "from" pattern with a portion of the HDL code and use the "to" pattern to transform the matched portions of the HDL code.

Legacy IP may refer to an older IC design that has not seen significant changes for many years. Third-party IP may refer to IC designs that are received from another party. It may be impractical or impossible to manually modify legacy IP or third-party IP because, among other things, the IC designs may not be understood by current users. Embodiments described herein are capable of transforming legacy IP and third-party IP.

Some embodiments described herein can transform HDL code on-the-fly. In other words, the original HDL code is not modified, and the HDL compiler is also not modified. Instead, a set of "from" patterns and "to" patterns (which may be stored separately from the HDL code) may be used by the HDL compiler to transform a given HDL code on-the-fly, and the transformed HDL code may then be used for further processing, e.g., for simulating the IC design.

Some embodiments described herein may represent a transformation using an HDL pattern file which includes code written in a language that includes HDL extensions. The HDL pattern file may be added to a given HDL file (e.g., Verilog file). In some embodiments described herein, a package may include an HDL transformation pattern file and a user's input HDL file (e.g., Verilog file) that describes an IC design. The package may be provided to a first stage in an IC design and verification flow. The first stage may generate a transformed representation of the IC design after performing transformations on the HDL file as per the transformations specified in the HDL transformation pattern file. For example, the first stage may be a compilation stage. A second stage, which occurs after the first stage in the IC design and verification flow, may then use the transformed representation of the IC design. For example, the second stage may be a simulation stage.

Advantages of embodiments described herein include, but are not limited to, (1) performing HDL code transformations accurately and consistently (e.g., without human errors), (2) allowing HDL code transformations to be performed in situations where performing manual code transformation is impractical, (3) performing HDL code transformations without the transformations being visible to competitors (e.g., because the transformation patterns are not visible to competitors), and (4) reducing the amount of time used for performing HDL code transformations.

FIG. 1 illustrates a process for performing HDL transformations in accordance with some embodiments described herein.

A transformation may be identified by a user (at 102). For example, a user may determine that a portion of HDL code may be optimized by replacing the portion of HDL code with a different HDL code. Next, one or more patterns may be created for the transformation using a pattern language (at 104). Specifically, the pattern language may be an HDL with extensions that allow transformation patterns to be specified. Examples of language extension features include, but are not limited to, (1) an extension to transform a statement into another statement, (2) an extension to transform an expression into another expression, and (3) an extension to transform a set of processes (e.g., initial or always functions), gates, and continuous assignments into a different set of processes, gates, and continuous assignments (e.g., an always function may be transformed into a continuous assignment in Verilog).

A compiler may then be used to compile the IC design code and the pattern file that contains the patterns (at 106). The compiled code may be tested to check if the transform has the desired effect (at 108). If all transformations have been processed ("Yes" branch from 110), then the pattern file may be added to the release build by checking-in the pattern file (at 112). On the other hand, if all transformations have not been processed ("No" branch from 110), then the process may return to 102.

Figure 2:
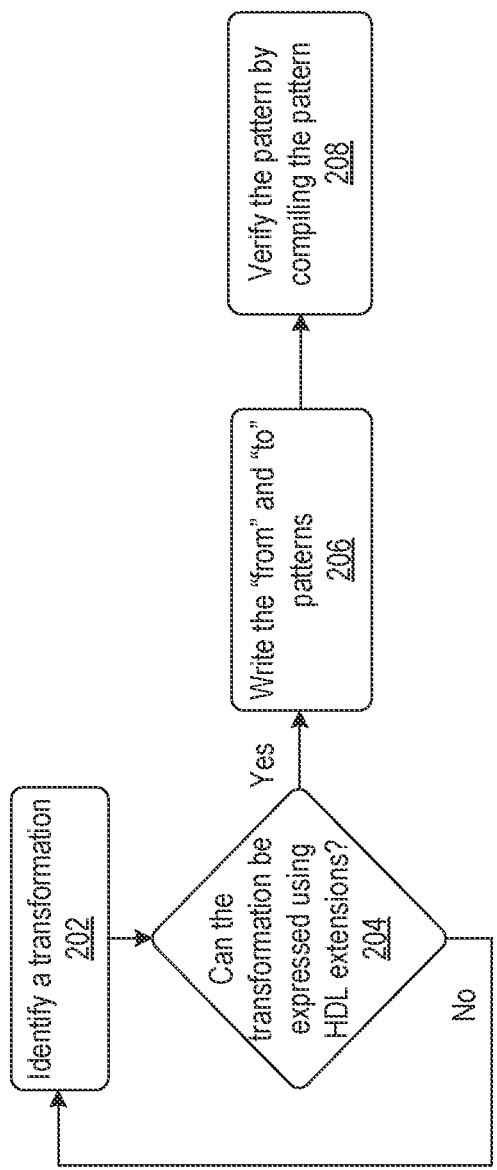
FIG. 2 illustrates a manual process for creating a transformation pattern in accordance with some embodiments described herein.

FIG. 2 illustrates a manual process for creating a transformation pattern in accordance with some embodiments described herein.

A transformation may be identified (at 202). Next, a user may check if the transformation can be expressed using HDL extensions (at 204). If so ("Yes" branch from 204), then the user can write the "from" and "to" patterns (at 206) and verify the pattern by compiling the pattern (at 208). On the other hand, if the transformation cannot be expressed using HDL extensions ("No" branch from 204), the process may return to 202.

Figure 3:
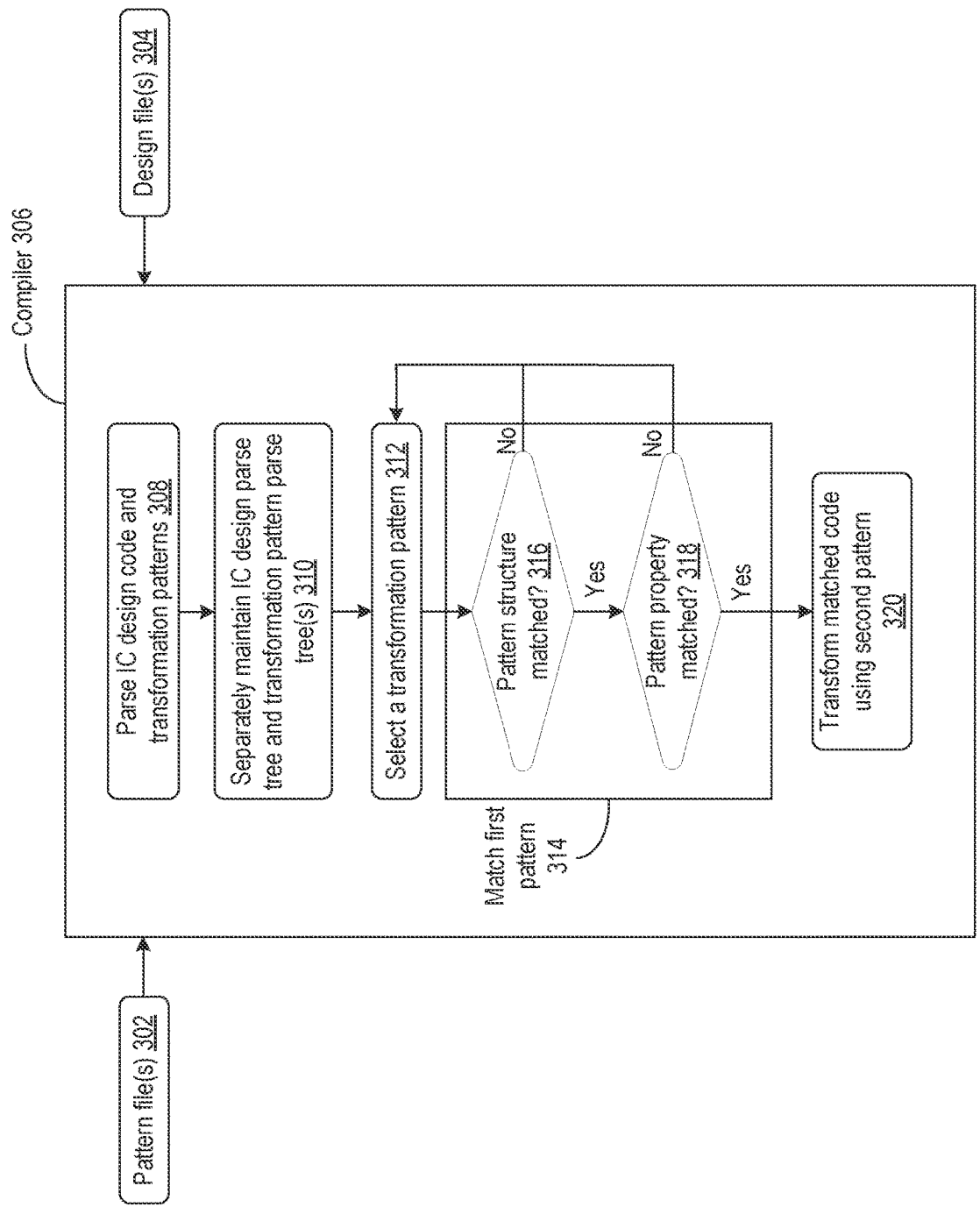
FIG. 3 illustrates the present process for transforming an IC design by using a transformation pattern in accordance with some embodiments described herein.

FIG. 3 illustrates a process for transforming an IC design by using a transformation pattern in accordance with some embodiments described herein.

One or more pattern files 302 and one or more design file 304 may be provided to compiler 306. Next, the IC design code (e.g., HDL code) in the design files and the transformation patterns in the pattern files may be parsed to obtain an IC design parse tree and one or more transformation pattern parse trees (at 308). An IC design parse tree represents the HDL code. An HDL has a grammar, which specifies the structure of valid HDL code. HDL code may be tokenized (i.e., broken up into lexical units), where the tokens are arranged in accordance with the grammar. For example, the grammar of an HDL may be described using a set of derivation rules (which may be specified using the Backus-Naur form) for constructing valid expressions and statements in the HDL based on tokens. The arrangement of the tokens and the interrelationships between the tokens (as defined by the grammar) may be represented by a parse tree. Compiler 306 may separately maintain the IC design parse tree and the transformation pattern parse tree(s) (at 310). For example, two separate parse tree objects may be created in memory, where one parse tree object may store the IC design parse tree and the other parse tree object may store the transformation pattern parse tree.

Compiler 306 may select a transformation pattern (at 312). The selected transformation pattern may include a first pattern (i.e., the "from" pattern) and a second pattern (i.e., the "to" pattern).

Next, the first pattern in the selected transformation pattern may be matched with the IC design code (at 314). Specifically, a structure of the first pattern may be matched (at 316) with a given portion of the IC design code and one or more properties of the first pattern may be matched (at 318) with the given portion of the IC design code. The structure of the first pattern may be the portion of the transformation pattern parse tree that corresponds to the first pattern. Specifically, at 316, the first pattern parse tree (which represents that structure of the first pattern) may be matched with a portion of the IC design parse tree. The first pattern parse tree may match the portion of the IC design parse tree if there exists a one-to-one correspondence between the nodes and edges of the first pattern parse tree and the portion of the IC design parse tree. At 318, a property specified in the first pattern may be matched with a property of the given portion of the IC design code. A property may be a semantic or syntactic property that is associated with the given portion of IC design code. For example, a node in the parse tree may correspond to a variable and the property of the node may specify what the variable represents, e.g., whether the variable represents a wire or a register.

If both the structure of the first pattern and the one or more properties of the first pattern match a given portion of the IC design code ("Yes" branches of 316 and 318), then the matched code may be transformed using the second pattern in the selected transformation pattern (320). Specifically, once the structure of the first pattern has been matched with that of the IC design code, then the properties of the nodes in the parse tree may be matched with the IC design code. The first pattern may match multiple portions of the IC design code, and each matching portion of the IC design code may be transformed using the second pattern.

If the first pattern does not match any portion of the IC design code ("No" branches from 316 and 318), then a next transformation pattern may be selected. In some embodiments described herein, a transformation pattern that does not match any portion of the IC design code may be deleted from the transformation pattern parse tree.

FIGS. 4-6 illustrate examples of transforming IC design code based on a transformation pattern in accordance with some embodiments described herein.

In FIG. 4, IC design code 402 includes "always" function 404, "always" function 406, and "initial" function 408. An "always" function specifies operations or events that take place whenever a set of conditions (which are specified in the always function) are satisfies. An "initial" function specifies operations or events that take place at the beginning of HDL code execution, e.g., at the beginning of IC design simulation. FIG. 5 illustrates a transformation pattern that includes "from" pattern 502 and "to" pattern 504. In general, a transformation pattern may include one or more of an expression pattern, a statement pattern, and statement block pattern. An HDL grammar may include multiple syntactical elements including, but not limited to, expressions, statements, and blocks of statements. An HDL expression may be used to calculate a value, an HDL statement may be used to perform an action or an event, and a block of statements may be used to perform a set of actions or events. Expression patterns may match HDL expressions, statement patterns may match HDL statements, and statement block patterns may match a block of HDL statements.

In particular, the line "(* vpt_module_from *)" specifies that the module underneath is a first pattern (i.e., a "from" pattern) that is matched with the IC design code. In other words, the module "test1_pat" in FIG. 5 represents the code pattern that the compiler tries to match. The line "(* vpt_module_to *)" specifies that the module underneath contains a second pattern (i.e., a "to" pattern) that is used to generate the transformed HDL code. Once the "from" pattern 502 is matched with a portion of the IC design code, the compiler generates transformed HDL code based on the "to" pattern 504 and replaces the matched portion of the IC design code with the generated transformed HDL code.

In "from" pattern 502, the line "$vptStmt("stmt1")" specifies a wild card statement. Any statement in that location in the HDL code is matched. The string "stmt1" is the wildcard identifier. If the wild card statement is present in the "to" module, then the code that matched the wildcard statement in the "from" pattern is substituted in place of the wild card statement. In other words, the portion of the IC design code that matches the wildcard statement in "from" pattern 502 is placed in the location where the wildcard statement occurs in "to" pattern 504.

In "from" pattern 502, the command "$vptNodeProperty( )" provides a node specific property. In particular, the line "$vptNodeProperty(a, "type:ignore")" specifies that the node has a property "type:ignore." In this example, the "type:ignore" specifier indicates that the current wire node is allowed to match other types of objects, which may include, but are not limited to, a register or a logic. A transformation pattern may also include a "(* vpt_pattern *)" line which specifies that the construct below is a pattern matching directive.

FIG. 6 illustrates a transformed IC design code 602 after the transformation pattern shown in FIG. 5 is applied to the IC design code in FIG. 4. Transformed IC design code 602 includes "initial" function 604 which corresponds to "initial" function 408, "always" function 606 which corresponds to transformed "always" function "404," and "always" function 608 which corresponds to transformed "always" function 406. Next, the IC design may be simulated by using transformed IC design code 602 (instead of using IC design code 402). Specifically, IC design code 402 may be matched against "from" pattern 502. Both "always" function 404 and "always" function 406 may match "from" pattern 502. In particular, other than using different variable names, the statement "always @(posedge (clk && (clk !==1'bx)))" in "always" function 404 is the same as "always @(posedge (a && (a !==1'bx)))." Thus, these two "always" functions in IC design code 402 match the "from" pattern 502. Accordingly, these functions are transformed based on "to" pattern 504, and the result of the transformation is shown in FIG. 6.

The following table illustrates examples of properties that may be used in a transformation pattern in accordance with some embodiments described herein.

| Property Type | Qualifier | Description |
| --- | --- | --- |
| Node | width:ignore | Ignore the width of the variable. |
| Node | vector | Is a vector. |
| Node | type:ignore | Ignore the type. |
| Node | type:2 state | Is a 2-state. |
| Node | reg | Is a register. |
| Node | wire | Is a wire. |
| Node | expr | Is an expression |
| Node | const | Is a constant. |
| Statement | for | Matches a "for" loop. |

-continued

| Property Type | Qualifier | Description |
|---|---|---|
| Statement | while | Matches a "while" loop. |
| Statement | if | Matches an "if" statement. |
| Statement | case | Matches a "case" statement. |
| Statement | delay | Matches a "delay" statement. |
| Statement | namedblock | Matches a named block. |
| Statement | taskcall | Matches a task call. |
| Statement | functioncall | Matches a function call. |
| Expression | xmr | Matches an "xmr" expression. |
| Expression | xmrowner | Specifies an "xmr" owner module name. |
| Expression | xmrtarget | Specifies an "xmr" owner target module name. |
| Expression | classref | Is a class reference object. |
| Expression | decompile_match | Matches decompiled string. |
| Expression | bitselect | Matches bit select. |
| Expression | partselect | Matches part select. |
| Expression | memoryword | Matches memory word. |
| Scope | modname | Pattern match in specified module. |
| Scope | tfname | Pattern match in specified task/function scope. |
| Scope | canresolve | Can resolve name. |
| Pattern | norecurse | Do not recurse after a match. |
| Pattern | stmtlist | Multiple statement pattern match. |
| Pattern | pullupdecl | Pull up local declarations. |

Figure 7:
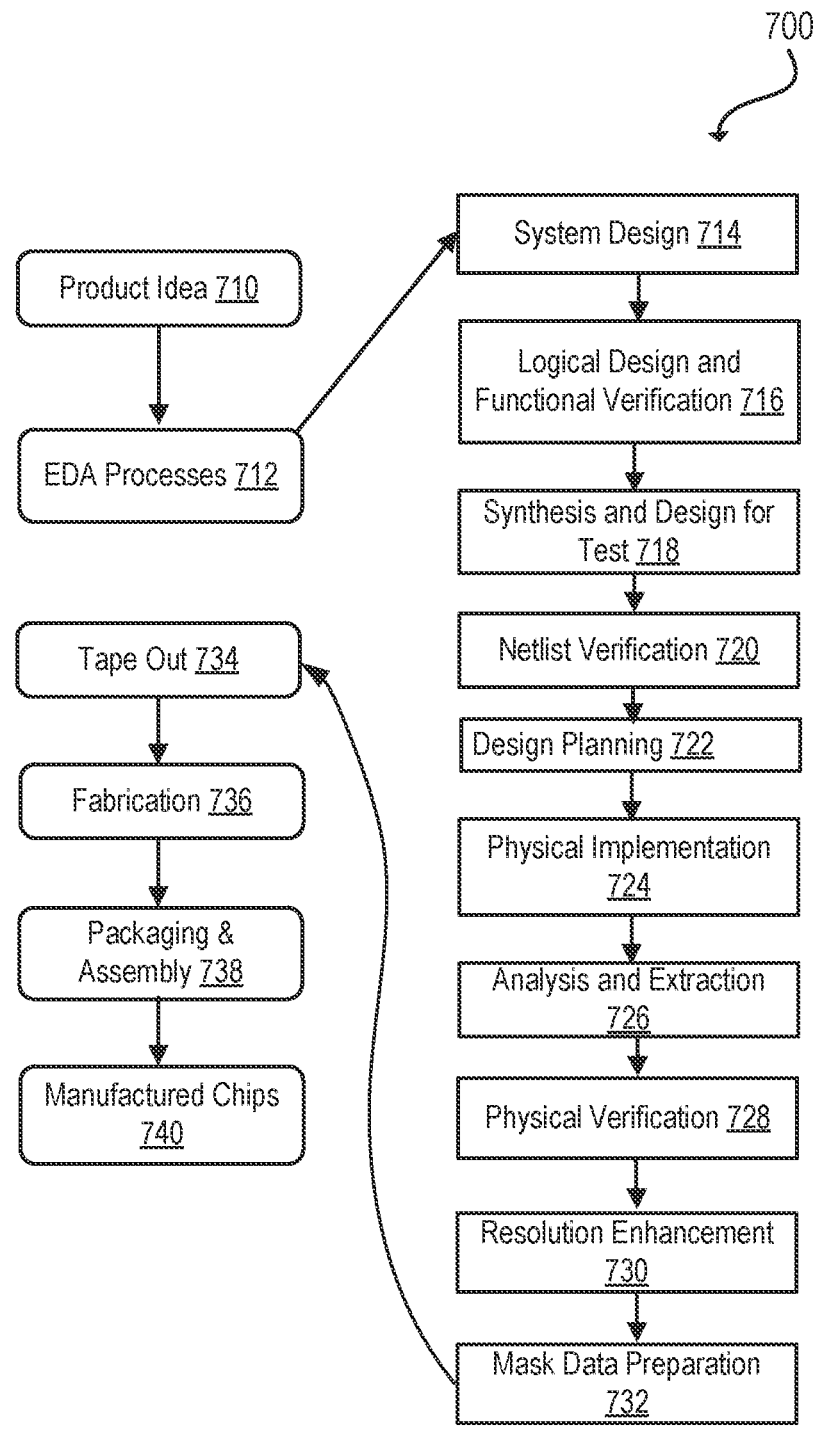
FIG. 7 illustrates an example flow for the design, verification, and fabrication of an integrated circuit in accordance with some embodiments described herein.

FIG. 7 illustrates an example flow 700 for the design, verification, and fabrication of an integrated circuit in accordance with some embodiments described herein. EDA processes 712 (the acronym "EDA" refers to "Electronic Design Automation") can be used to transform and verify design data and instructions that represent the integrated circuit. Each of these processes can be structured and enabled as multiple modules or operations.

Flow 700 can start with the creation of a product idea 710 with information supplied by a designer, information which is transformed and verified by using EDA processes 712. When the design is finalized, the design is taped-out 734, which is when artwork (e.g., geometric patterns) for the integrated circuit is sent to a fabrication facility to manufacture the mask set, which is then used to manufacture the integrated circuit. After tape-out, a semiconductor die is fabricated 736 and packaging and assembly 738 are performed to produce the manufactured IC chip 740.

Specifications for a circuit or electronic structure may range from low-level transistor material layouts to high-level description languages. A high-level of representation may be used to design circuits and systems, using a hardware description language ("HDL") such as VHDL, Verilog, SystemVerilog, SystemC, MyHDL or OpenVera. The HDL description can be transformed to a logic-level register transfer level ("RTL") description, a gate-level description, a layout-level description, or a mask-level description. Each lower representation level that is a more detailed description adds more detail into the design description. The lower levels of representation that are more detailed descriptions can be generated by a computer, derived from a design library, or created by another design automation process. An example of a specification language at a lower level of representation language for specifying more detailed descriptions is SPICE (which stands for "Simulation Program with Integrated Circuit Emphasis"). Descriptions at each level of representation contain details that are sufficient for use by the corresponding tools of that layer (e.g., a formal verification tool).

During system design 714, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 716, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' are used to speed up the functional verification.

During synthesis and design for test 718, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 720, the netlist is checked for compliance with timing constraints and for correspondence with the HDL code. During design planning 722, an overall floor plan for the integrated circuit is constructed and analyzed for timing and top-level routing.

During layout or physical implementation 724, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 726, the circuit function is verified at the layout level, which permits refinement of the layout design. During physical verification 728, the layout design is checked to ensure that manufacturing constraints are correct, such as DRC constraints, electrical constraints, lithographic constraints, and that circuitry function matches the HDL design specification. During resolution enhancement 730, the geometry of the layout is transformed to improve how the circuit design is manufactured.

During tape-out, data is created to be used (after lithographic enhancements are applied if appropriate) for production of lithography masks. During mask data preparation 732, the 'tape-out' data is used to produce lithography masks that are used to produce finished integrated circuits.

A storage subsystem of a computer system (such as computer system 800 of FIG. 8) may be used to store the programs and data structures that are used by some or all of the EDA products described herein, and products used for development of cells for the library and for physical and logical design that use the library.

Figure 8:
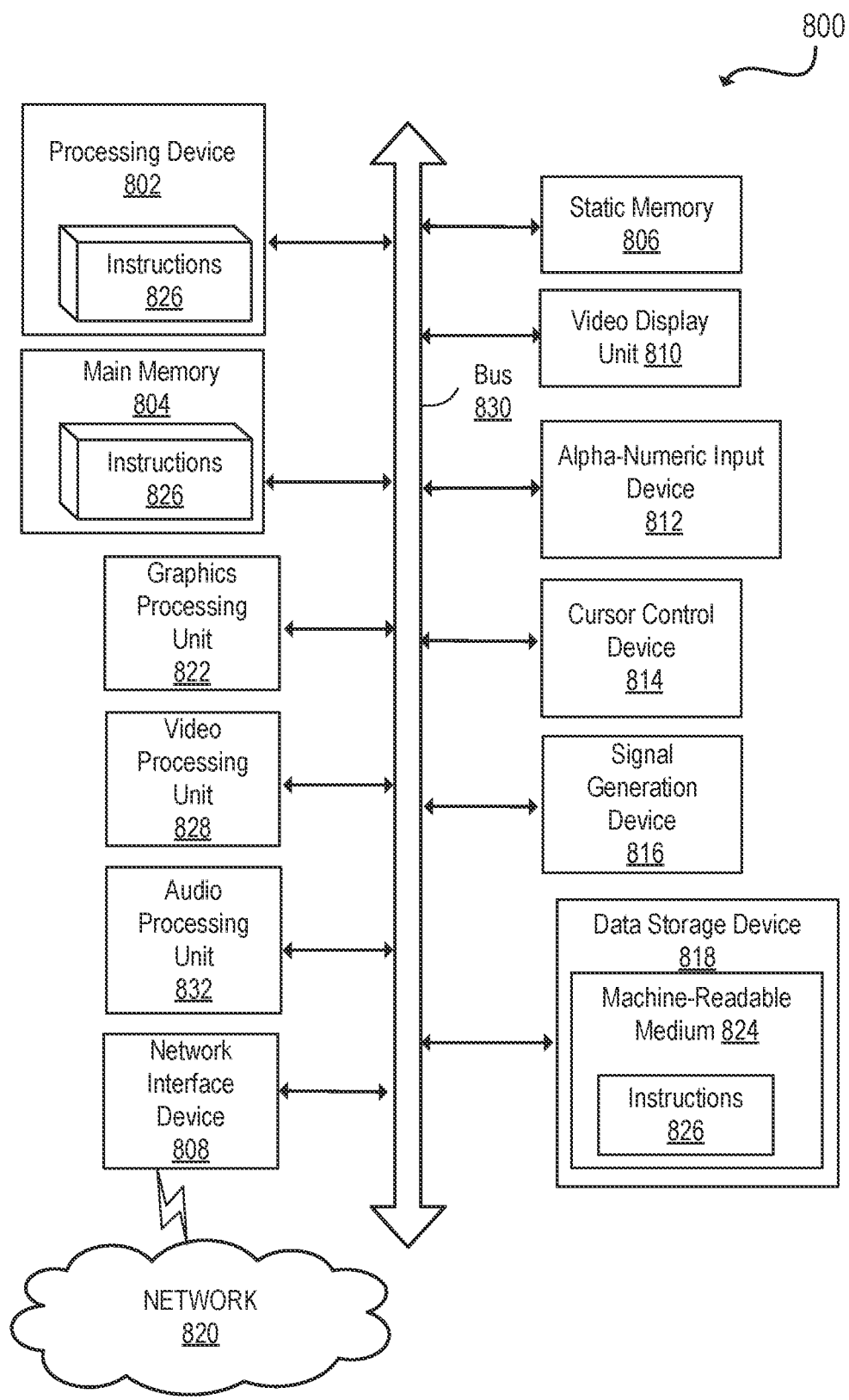
FIG. 8 illustrates an example machine of a computer system 800 within which a set of instructions, for causing the machine to perform any one or more of the methodologies discussed herein, may be executed in accordance with some embodiments described herein.

FIG. 8 illustrates an example machine of a computer system 800 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 800 includes a processing device 802, a main memory 804 (e.g., read-only memory (ROM), flash memory, dynamic random access memory (DRAM) such as synchronous DRAM (SDRAM), a static memory 806 (e.g., flash memory, static random access memory (SRAM), etc.), and a data storage device 818, which communicate with each other via a bus 830.

Processing device 802 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 802 may also be one or more special-purpose processing devices such as an application specific integrated circuit (ASIC), a field programmable gate array (FPGA), a digital signal processor (DSP), network processor, or the like. The processing device 802 may be configured to execute instructions 826 for performing the operations and steps described herein.

The computer system 800 may further include a network interface device 808 to communicate over the network 820. The computer system 800 also may include a video display unit 810 (e.g., a liquid crystal display (LCD) or a cathode ray tube (CRT)), an alphanumeric input device 812 (e.g., a keyboard), a cursor control device 814 (e.g., a mouse), a graphics processing unit 822, a signal generation device 816 (e.g., a speaker), graphics processing unit 822, video processing unit 828, and audio processing unit 832.

The data storage device 818 may include a machine-readable storage medium 824 (also known as a non-transitory computer-readable medium) on which is stored one or more sets of instructions 826 or software embodying any one or more of the methodologies or functions described herein. The instructions 826 may also reside, completely or at least partially, within the main memory 804 and/or within the processing device 802 during execution thereof by the computer system 800, the main memory 804 and the processing device 802 also constituting machine-readable storage media.

In some implementations, the instructions 826 include instructions to implement functionality corresponding to the present disclosure. While the machine-readable storage medium 824 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 802 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A method, comprising:
   parsing hardware description language (HDL) code for an integrated circuit (IC) design to obtain an IC design parse tree;
   parsing a transformation pattern to obtain a transformation pattern parse tree, the transformation pattern comprising a first pattern and a second pattern wherein the first pattern and the second pattern are specified using a language extension of the HDL;
   using the IC design parse tree and the transformation pattern parse tree to identify a portion of the HDL code that matches the first pattern;
   transforming, by a processor, the portion of the HDL code based on the second pattern to obtain a transformed portion of the HDL code; and
   replacing the portion of the HDL code by the transformed portion of the HDL code.

2. The method of claim 1, wherein the using the IC design parse tree and the transformation pattern parse tree to identify the portion of the HDL code that matches the first pattern comprises matching the transformation pattern parse tree with a portion of the IC design parse tree that corresponds to the portion of the HDL code.

3. The method of claim 1, wherein the using the IC design parse tree and the transformation pattern parse tree to identify the portion of the HDL code that matches the first pattern comprises matching a property specified in the first pattern with a property of the portion of the HDL code.

4. The method of claim 1, wherein the IC design parse tree and the transformation pattern parse tree are maintained separately.

5. The method of claim 1, wherein the transformation pattern comprises one or more of an expression pattern, a statement pattern, and a statement block pattern.

6. The method of claim 1, further comprising simulating the IC design using the transformed portion of the HDL code.

7. A non-transitory storage medium storing instructions, which when executed by a processor, cause the processor to:
   parse hardware description language (HDL) code for an integrated circuit (IC) design to obtain an IC design parse tree;
   parse a transformation pattern to obtain a transformation pattern parse tree, the transformation pattern comprising a first pattern and a second pattern, wherein the first pattern and the second pattern are specified using a language extension of the HDL;
   use the IC design parse tree and the transformation pattern parse tree to identify a portion of the HDL code that matches the first pattern;
   transform the portion of the HDL code based on the second pattern to obtain a transformed portion of the HDL code; and
   replace the portion of the HDL code by the transformed portion of the HDL code.

8. The non-transitory storage medium of claim 7, wherein the using the IC design parse tree and the transformation pattern parse tree to identify the portion of the HDL code that matches the first pattern comprises matching the transformation pattern parse tree with a portion of the IC design parse tree that corresponds to the portion of the HDL code.

9. The non-transitory storage medium of claim 7, wherein the using the IC design parse tree and the transformation pattern parse tree to identify the portion of the HDL code that matches the first pattern comprises matching a property specified in the first pattern with a property of the portion of the HDL code.

10. The non-transitory storage medium of claim 7, wherein the IC design parse tree and the transformation pattern parse tree are maintained separately.

11. The non-transitory storage medium of claim 7, wherein the transformation pattern comprises one or more expression patterns, one or more statement patterns, one or more statement block patterns, or a combination thereof.

12. The non-transitory storage medium of claim 7, wherein the instructions, which when executed by the processor, cause the processor to simulate the IC design using the transformed portion of the HDL code.

13. A system comprising:
   a memory storing instructions; and
   a processor, coupled with the memory and to execute the instructions, the instructions when executed cause the processor to:
      parse hardware description language (HDL) code for an integrated circuit (IC) design to obtain an IC design parse tree;
      parse a transformation pattern to obtain a transformation pattern parse tree, the transformation pattern comprising a first pattern and a second pattern, wherein the first pattern and the second pattern are specified using a language extension of the HDL;
      use the IC design parse tree and the transformation pattern parse tree to identify a portion of the HDL code that matches the first pattern;
      transform the portion of the HDL code based on the second pattern to obtain a transformed portion of the HDL code; and
      replace the portion of the HDL code by the transformed portion of the HDL code.

14. The system of claim 13, wherein the using the IC design parse tree and the transformation pattern parse tree to identify the portion of the HDL code that matches the first pattern comprises matching the transformation pattern parse tree with a portion of the IC design parse tree that corresponds to the portion of the HDL code.

15. The system of claim 13, wherein the using the IC design parse tree and the transformation pattern parse tree to identify the portion of the HDL code that matches the first pattern comprises matching a property specified in the first pattern with a property of the portion of the HDL code.

16. The system of claim 13, wherein the IC design parse tree and the transformation pattern parse tree are maintained separately.

17. The system of claim 13, wherein the transformation pattern comprises one or more expression patterns, one or more statement patterns, one or more statement block patterns, or a combination thereof.

* * * * *